United States Patent
Chen et al.

[11] Patent Number: 6,106,308
[45] Date of Patent: Aug. 22, 2000

[54] CONTACT OF AN ELECTRICAL CONNECTOR HAVING SOLDER TERMINAL CAPABLE OF FITTING WITH A HOUSING OF THE CONNECTOR

[75] Inventors: Hsiang-Ping Chen, Lu-Chou; Tsung-Hsi Ou Lee, Taipei, both of Taiwan

[73] Assignee: Hon Hai Precision Ind. Co., Ltd., Taipei Hsien, Taiwan

[21] Appl. No.: 09/217,675

[22] Filed: Dec. 21, 1998

[30] Foreign Application Priority Data

Dec. 31, 1997 [TW] Taiwan ................................. 88221849

[51] Int. Cl.⁷ .................................................. H01R 12/00
[52] U.S. Cl. ................................................. 439/79; 439/80
[58] Field of Search ................................. 439/55, 75, 78, 439/79, 80, 81, 83, 84

[56] References Cited

U.S. PATENT DOCUMENTS

| | | | |
|---|---|---|---|
| 4,746,301 | 5/1988 | Key | 439/82 |
| 4,842,528 | 6/1989 | Frantz | 439/80 |
| 4,842,554 | 6/1989 | Cosmos et al. | 439/609 |
| 5,549,480 | 8/1996 | Cheng | 439/79 |
| 5,702,257 | 12/1997 | Millhimes | 439/79 |

*Primary Examiner*—Brian Sircus
*Assistant Examiner*—Michael C. Zarroli

[57] ABSTRACT

The present invention provides a contact which facilitates proper insertion into a housing of an electrical connector without deflection of the contact after configuration. The contact of the electrical connector comprises a main plate having a central flat portion and two bent sides projecting therefrom and facing each other. A mating terminal includes two clamping branches respectively extending from the bent sides of the main plate along a longitudinal axis of the main plate. A compliant pin extends from one end of the central flat portion of the main plate opposite the extending direction of the mating terminal and is substantially right angled at an intermediate portion thereof. A tail terminates from the compliant pin and defines a hole therein for engagement with a hole of a circuit board. A curved shoulder is formed near the tail for facilitating insertion of the tail into the hole of the printed circuit board. The curved shoulder fits within the housing if the connector when the contact is assembled in the housing.

4 Claims, 6 Drawing Sheets

ND OF THE INVENTION

1. Field of The Invention

The present invention relates to a contact for an electrical connector, and especially to a right angled compliant pin having a positioning portion for firmly fitting in a housing of the electrical connector.

2. The Prior Art

Compliant pins have become popular in establishing contact with the conductors in a multi-layer board, a back plane, or a simple circuit board having a plated through hole. A compliant pin has a compliant portion which has a normal width greater than the hole diameter but which can be deformed when it is loaded into the circuit board hole so that contact edge portions of the compliant portion will establish the electrical connection required with the conductors in the circuit board hole. The compliant portion thus is essentially a relatively stiff spring arrangement which, after insertion into the circuit board hole, will bear against the surface of the hole with sufficient force to retain the pin in the circuit board and to establish a sound electrical contact with the circuit board conductors.

Some commonly known types of compliant pins are shown in U.S. Pat. Nos. 4,186,982, 4,743,081, 4,206,964, and 4,606,589. Right angled compliant contacts in a receptacle connector usually have two clamping arms for engagement with corresponding contacts of a complementary connector upon insertion of the latter. The contact is bent substantially 90 degrees before terminating into a soldering tail.

FIGS. 5 and 6 show a conventional right angled contact 7 having an intermediate portion 70 bent to form a substantially right angled structure, and a clamping portion 73 and a soldering tail 71 respectively extending from opposite ends of the intermediate portion 70. A U-shaped portion 74 is formed between the intermediate portion 70 and the clamping portion 73. A shoulder 72 extends laterally from two sides of the soldering tail 71 providing exerting points for a jig (not shown) or the like to insert the tail 71 into holes of a positioning plate 75 of a related connector 78 thereby allowing the penetrated tail 71 (through the positioning plate 75) to be further inserted into a corresponding hole of a circuit board 76. However, the exertion points on the shoulder 72 may not be balanced during exertion by the jig, therefore the contact 7 is apt to be inserted into the positioning plate 75 at a slant thereby damaging the holes of the positioning plate 75 and resulting in a poor soldering effect on the circuit board 76 as specifically shown in FIG. 6.

Hence, an improved electrical contact is requisite to overcome the disadvantages of the prior art.

SUMMARY OF THE INVENTION

An electrical connector comprises a housing formed with a positioning plate, the positioning plate defining a plurality of S-shaped holes therein. A plurality of contacts each has a main plate, a mating terminal and a compliant pin extending from one end of the main plate. The compliant pin has a tail for being inserted into a printed circuit board and an S-shaped shoulder above the tail. After assembly of the housing and the contacts, the contacts are received in the housing, the shoulders fitting in the holes. The S-shaped shoulders and the corresponding S-shaped holes cooperatively facilitate the insertion of the compliant pins into the holes of the printed circuit board without damage to the compliant pins.

These and additional objectives, features, and advantages of the present invention will become apparent after reading the following detailed description of the preferred embodiment taken in conjunction with the appended drawing figures.

DETAILED DESCRIPTION OF THE PREFERRED EMBODIMENT

Figure 1:
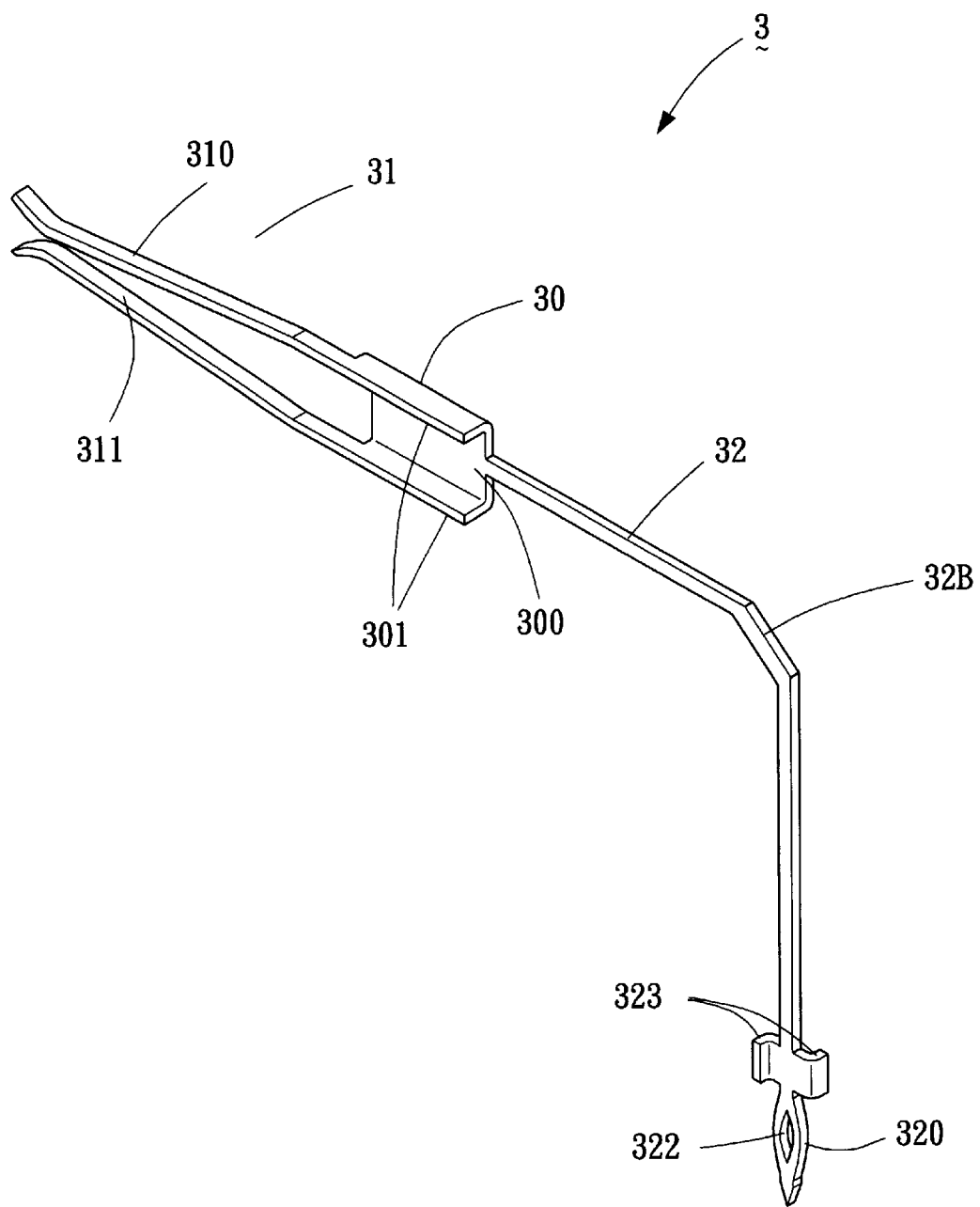
FIG. 1 is a perspective view of a contact in accordance with the present invention.
Figure 2:
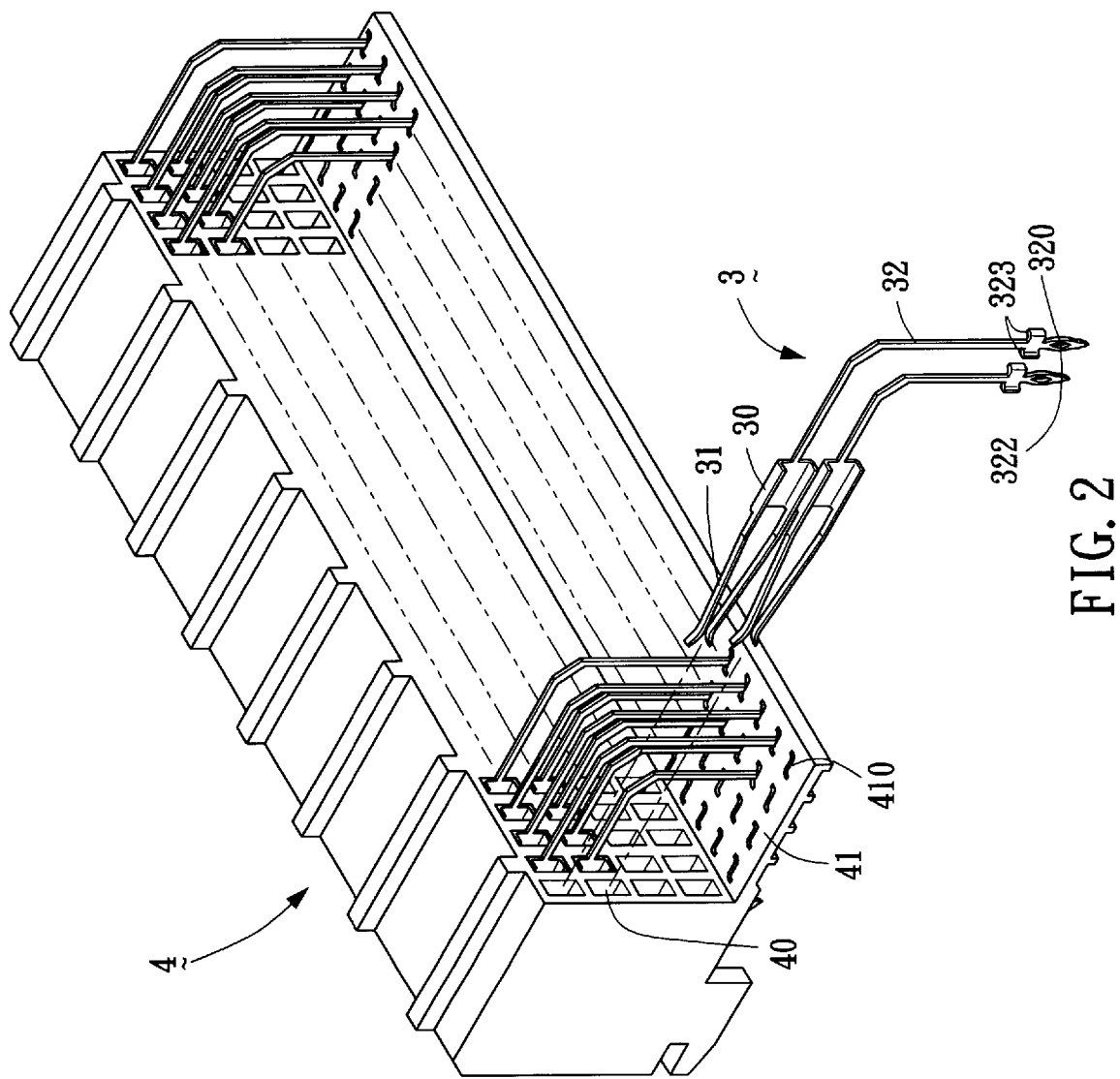
FIG. 2 is a perspective view of a receptacle connector receiving a plurality of the contacts shown in FIG. 1 therein.

Referring to FIGS. 1 and 2, a contact 3 of an electrical connector 4 comprises a main plate 30 having a central flat portion 300 and two bent sides 301 projecting therefrom and facing each other. A mating terminal 31 includes two clamping branches 310, 311 respectively extending from the two sides 301 of the main plate 30 in substantially a same direction along a longitudinal axis of the main plate 30 for effectively contacting with a corresponding pin of a complementary connector (not shown). Specifically, the branches 310, 311 firstly converge for a relatively long distance and then diverge for a relatively short distance thereby forming a reception portion for receiving a pin from the complementary connector.

A compliant pin 32 extends from one end of the main plate 30 opposite the extending direction of the mating terminal 31 and is substantially right angled at an intermediate portion thereof. The compliant pin 32 and the central portion 300 of main plate 30 are coplanar. The right angled portion of the soldering terminal 32 includes an intermediate curved portion 32B which is formed by stamping rather than by bending. The soldering terminal 32 is terminated at a tail 320 defining a hole 322 therein for functioning as a compliant pin.

Figure 3:
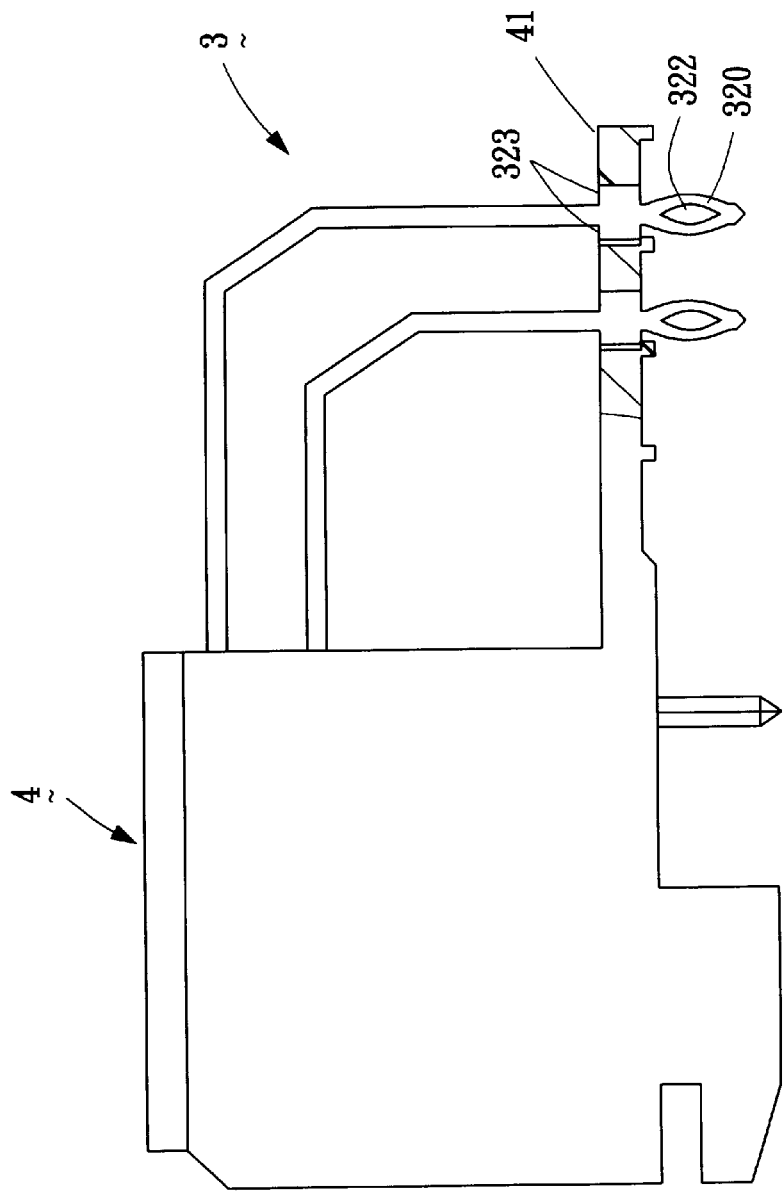
FIG. 3 is a side view of the connector of FIG. 2, wherein a portion thereof is shown in cross-sectional view.

A shoulder 323 is formed above the tail 320 and has an S-shaped structure for cooperating with a jig (not shown) or a positioning closure having ribs (not shown) to insert the tail 320 into a hole 410 of a positioning plate 41 of the connector 4 with an even force thereby preventing deflection of the contact 3. The connector 4 defines a plurality of passageways 40 for interferentially retaining the main body 30 of the contact 3 therein with the mating terminal 31 being deformably received therein for engagement with a pin from a complementary connector (not shown). Since the hole 410 is S-shaped for substantially mating with the shoulder 323 of the contact 3, the insertion of the shoulder 323 into the S-shaped hole 410 will not deflect the contact 3. In other words, the S-shaped structure of the shoulder 323 can prevent the contact 3 from being inserted into the hole 410 at a slant, as shown in FIG. 3.

Figure 4:
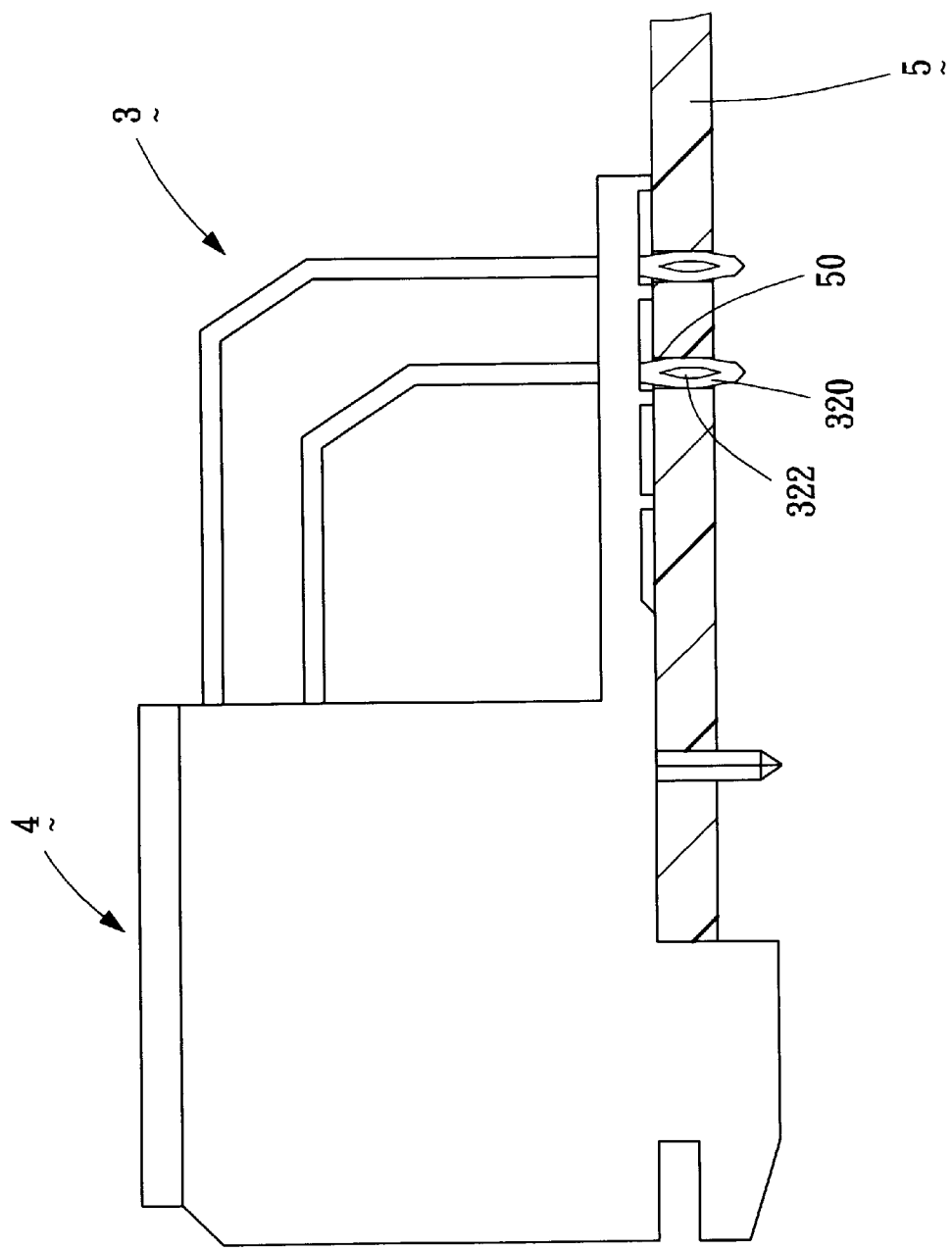
FIG. 4 is a side view of the connector of FIG. 2 mounted on a circuit board.
Figure 5:
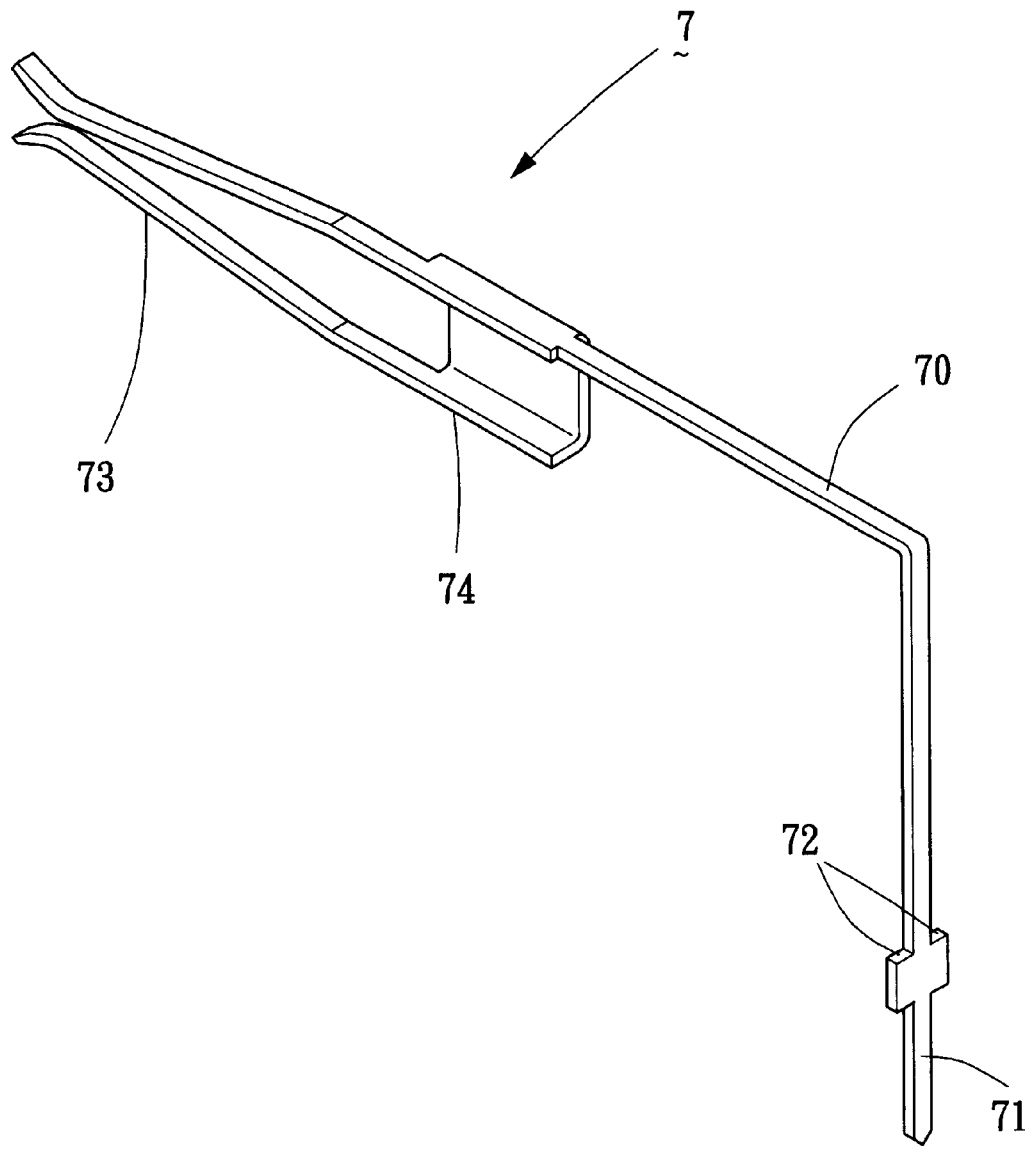
FIG. 5 is a conventional right angled contact.
Figure 6:
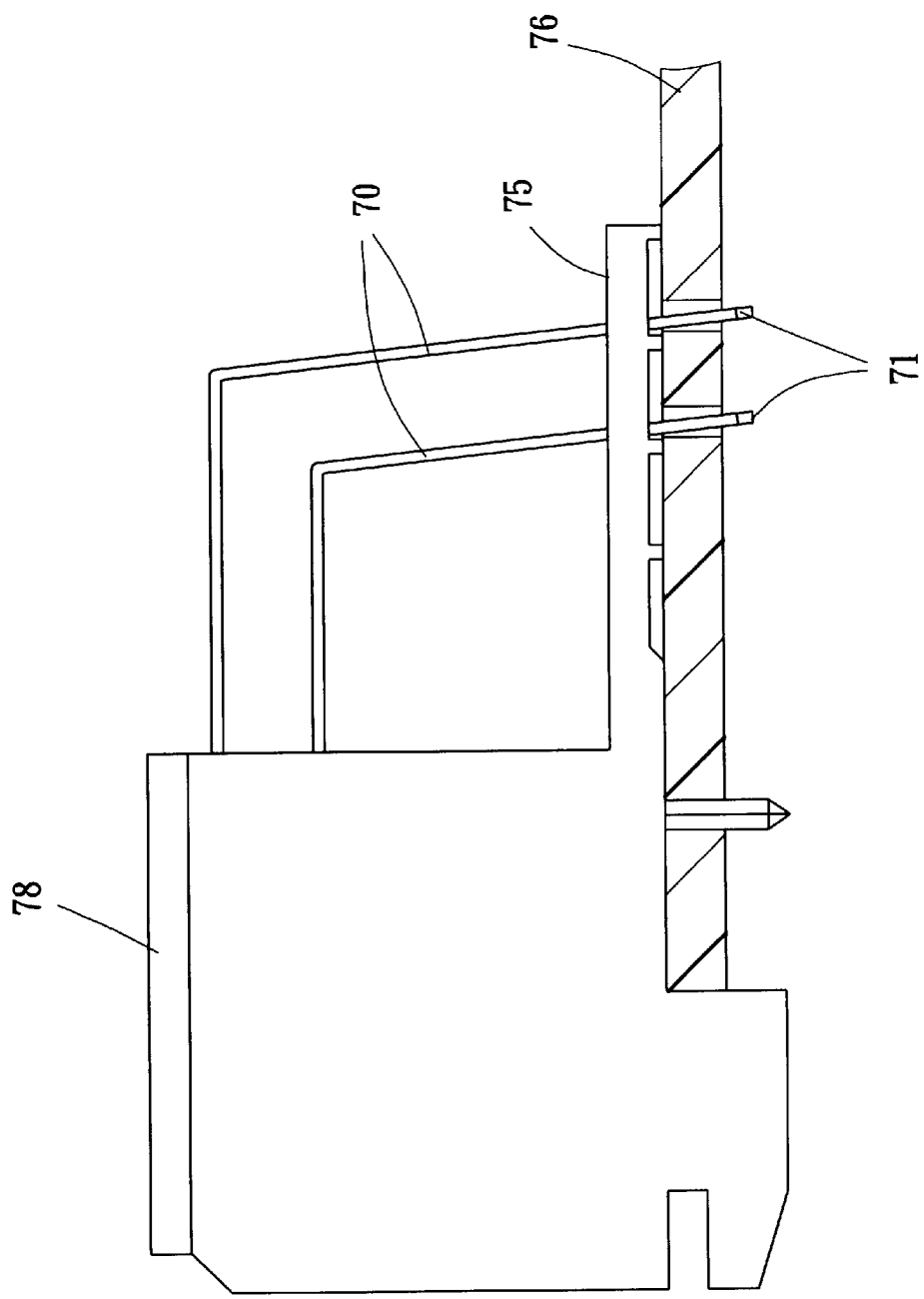
FIG. 6 shows the conventional contact of FIG. 5 configured in a positioning plate of a connector with deflection.

Referring to FIG. 4, the connector 4 is mounted on a printed circuit board 5 defining a plurality of holes 50 therein for receiving and retaining the tail 320 of each contact 3. Since each tail 320 defines a hole 322 therein, the engagement between the tail 320 and the hole 50 can be achieved due to the compliant effect therebetween.

While the present invention has been described with reference to a specific embodiment, the description is illustrative of the invention and is not to be construed as limiting the invention. Various modifications to the present invention can be made to the preferred embodiment by those skilled in the art without departing from the true spirit and scope of the invention as defined by the appended claims.

We claim:

1. A contact of an electrical connector comprising a main plate having a central flat portion and two bent sides projecting therefrom and facing each other, a mating terminal including two clamping branches respectively extending from the bent sides of the main plate along a longitudinal axis of the main plate, a compliant pin extending from one end of the central flat portion of the main plate opposite the extending direction of the mating terminal and curved to be substantially right angled at an intermediate portion thereof, the compliant pin being coplanar with the central flat portion of the main plate, a tail terminating from the compliant pin and defining a hole therein for engagement with a hole of a circuit board, and a curved shoulder with an S-shaped structure formed near the tail for facilitating insertion of the tail into the hole of the printed circuit board.

2. The contact of an electrical connector as claimed in claim 1, wherein the right angled portion of the soldering terminal is a curved portion formed by stamping rather than by bending.

3. The contact of an electrical connector as claimed in claim 2, wherein the clamping branches firstly converge for a relatively long distance and then diverge for a relatively short distance thereby forming a reception portion for receiving a pin from a complementary connector.

4. A connector comprising:

a horizontal positioning plate defining a plurality of S-shaped holes extending therethrough in a vertical direction; and a plurality of contacts corresponding to said holes, respectively, each of said contacts including a main plate with a mating terminal extending horizontally, and a solder terminal extending opposite to said mating terminal at a right angle; wherein an S-shaped shoulder is formed on the solder terminal above a tail thereof so as to evenly have the tail extend through the corresponding hole and below the positioning plate until the S-shaped shoulder is fittingly received within said hole.

* * * * *